(12) United States Patent
Kawai

(10) Patent No.: US 8,294,231 B2
(45) Date of Patent: Oct. 23, 2012

(54) OPTICAL SENSING DEVICE INCLUDING VISIBLE AND UV SENSORS

(75) Inventor: Yasuaki Kawai, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 729 days.

(21) Appl. No.: 12/407,805

(22) Filed: Mar. 20, 2009

(65) Prior Publication Data
US 2009/0243019 A1 Oct. 1, 2009

(30) Foreign Application Priority Data
Mar. 27, 2008 (JP) ................................. 2008-082936

(51) Int. Cl.
*H01L 31/00* (2006.01)
(52) U.S. Cl. .................. 257/440; 438/57; 257/E27.137; 257/E27.14
(58) Field of Classification Search ............. 257/E27.14, 257/E27.138, E27.135
See application file for complete search history.

(56) References Cited

U.S. PATENT DOCUMENTS

| | | | |
|---|---|---|---|
| 6,452,669 B1* | 9/2002 | Morris et al. ................. | 356/215 |
| 2003/0189237 A1* | 10/2003 | Koizumi ....................... | 257/461 |
| 2007/0218578 A1* | 9/2007 | Lee et al. ....................... | 438/48 |

FOREIGN PATENT DOCUMENTS

| | | |
|---|---|---|
| JP | 07-162024 | 6/1995 |
| JP | 2004-006694 | 1/2004 |

* cited by examiner

*Primary Examiner* — Ha Tran T Nguyen
*Assistant Examiner* — Aaron Dehne
(74) *Attorney, Agent, or Firm* — Volentine & Whitt, PLLC

(57) ABSTRACT

An optical sensing device includes a silicon-on-insulator (SOI) substrate a semiconductor support substrate, an insulating layer located on the semiconductor support substrate, and a semiconductor layer located on the insulating layer. The optical sensing device further includes a visible light sensor located in the semiconductor support substrate, and an ultraviolet ray sensor located in the semiconductor layer.

20 Claims, 11 Drawing Sheets

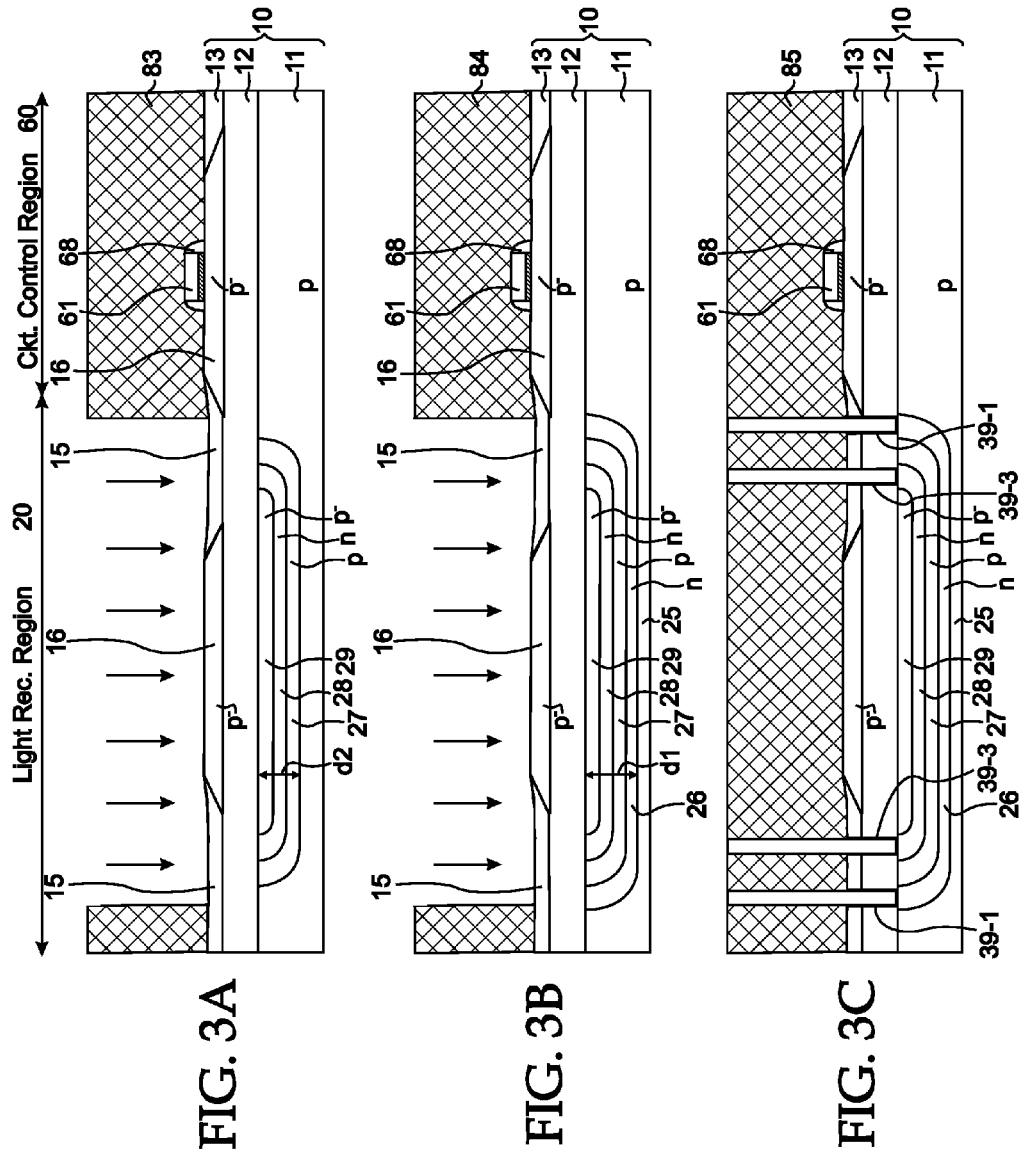

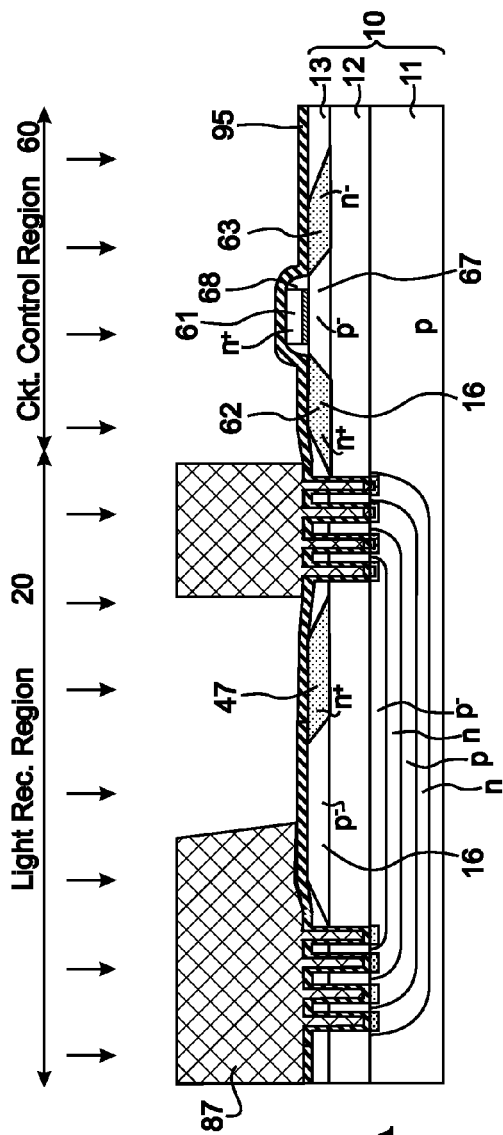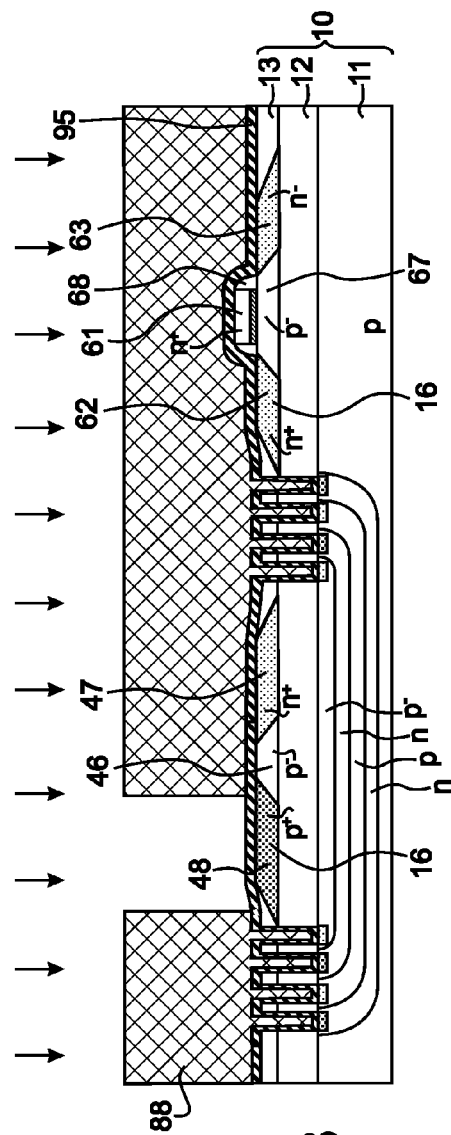
FIG. 5A
FIG. 5B

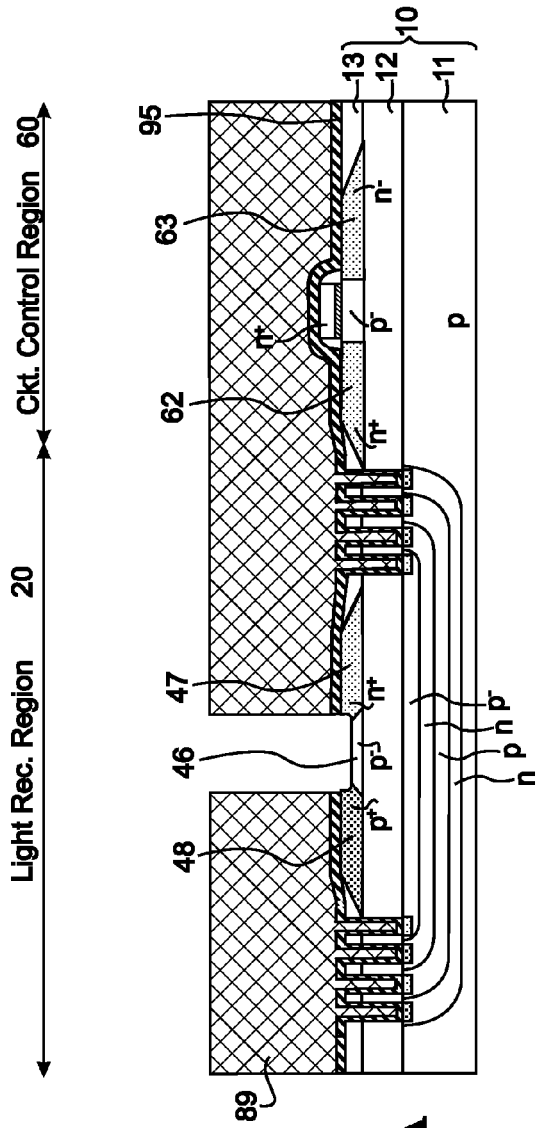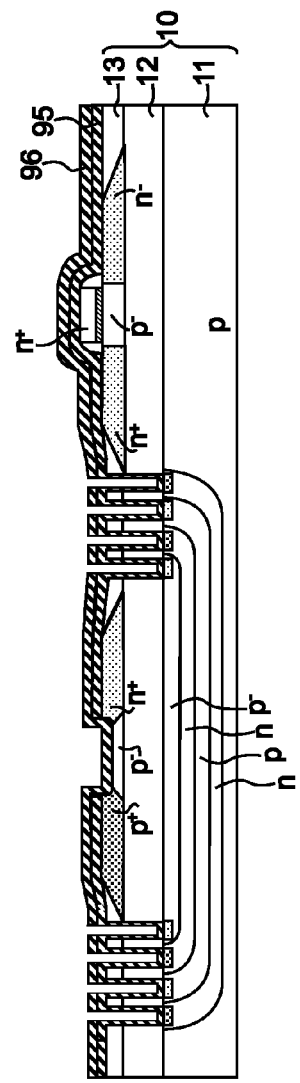
FIG. 7A
FIG. 7B

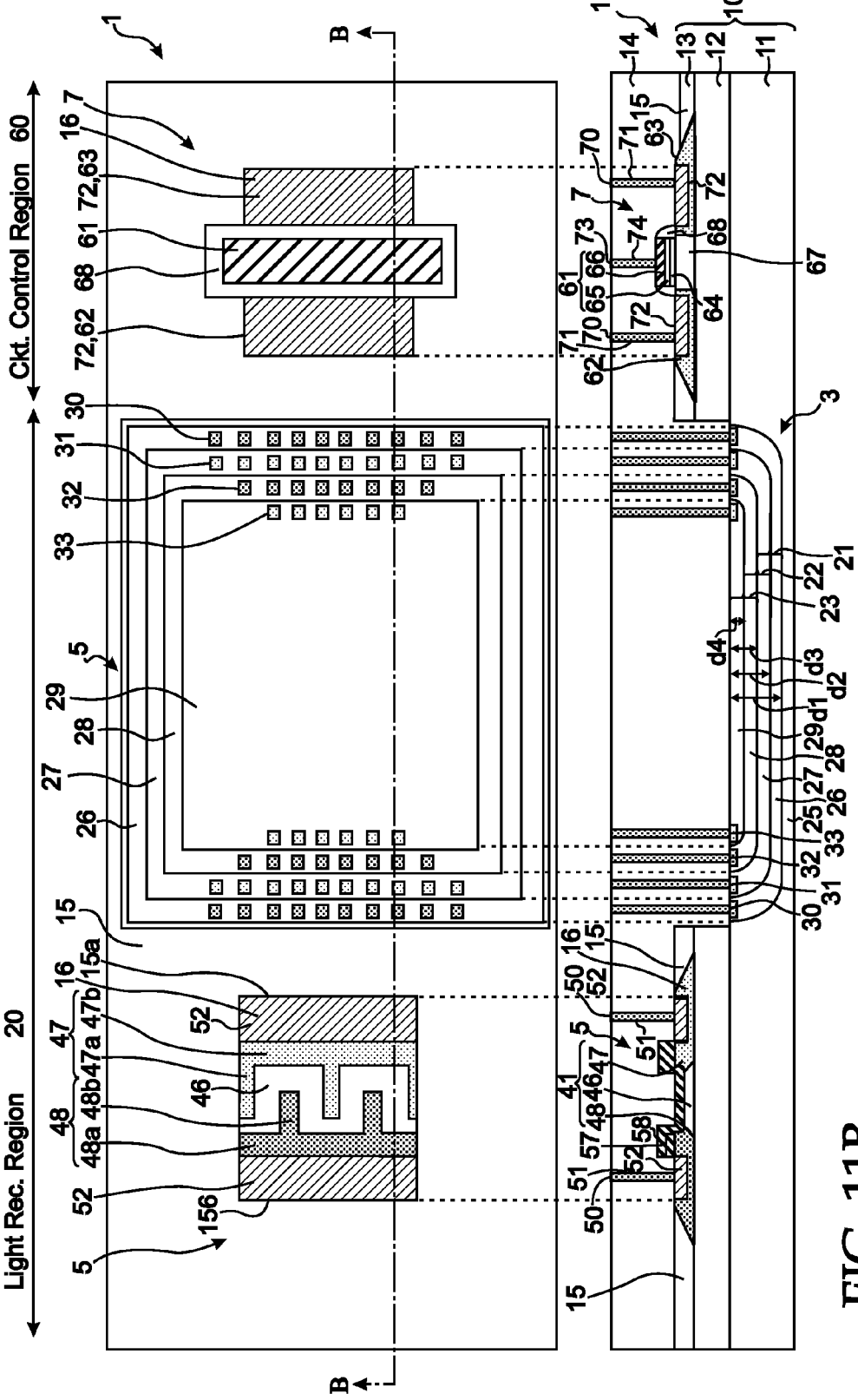

OPTICAL SENSING DEVICE INCLUDING VISIBLE AND UV SENSORS

BACKGROUND OF THE INVENTION

1. Field of the Invention

The present invention generally relates optical sensors, and more particularly, the present invention relates to an optical sensor device in which an ultraviolet ray sensor and a visible light sensor are integrated into a single chip.

2. Description of the Related Art

Japanese Patent Application Laid-Open No. 7-162024 discloses an example of ultraviolet ray sensor (UV sensor) having a structure in which a light receiving device is formed in a semiconductor layer on an insulating substrate. The sensitivity of the light receiving device is primarily in the ultraviolet spectrum.

In the meantime, Japanese Patent Application Laid-Open No. 2004-006694 discloses an example of a visible light sensor. In this publication, a light receiving device is described having a structure in which an n-type region is formed within a p-type silicon substrate and a p-type region is formed within the n-type region, to thereby form two photodiodes in a vertical direction. In the light receiving device, outputs from these two photodiodes are processed to realize a visible light sensor. Such is also referred to as an intensity sensor since it measures an intensity of the visible light.

Products having the functionality of both an ultraviolet ray sensor and a visible light sensor incorporate two separately fabricated semiconductor chips into a single package, i.e., one chip for the UV sensor and another chip for the visible light sensor.

SUMMARY OF THE INVENTION

According to an aspect of the present invention, an optical sensing device is provided which includes a silicon-on-insulator (SOI) substrate including a semiconductor support substrate, an insulating layer located on the semiconductor support substrate, and a semiconductor layer located on the insulating layer. The optical sensing device further includes a visible light sensor located in the semiconductor support substrate, and an ultraviolet ray sensor located in the semiconductor layer.

BRIEF DESCRIPTION OF THE DRAWINGS

The above and other aspects and features of the present invention will become readily apparent from the detailed description that follows, with reference to the accompanying drawings, in which:

FIGS. 3A to 3C are cross-sectional views (relative to line B-B of FIG. 1B) for use the fabrication of the semiconductor device according to the embodiment of the present invention;

FIGS. 5A and 5B are cross-sectional views (relative to line B-B of FIG. 1B) for use the fabrication of the semiconductor device according to the embodiment of the present invention;

FIGS. 7A and 7B are cross-sectional views (relative to line B-B of FIG. 1B) for use the fabrication of the semiconductor device according to the embodiment of the present invention;

FIGS. 11A and 11B are a top plan view and a cross-sectional view, respectively, illustrating a structure of a semiconductor device according to another embodiment of the present invention.

DESCRIPTION OF THE PREFERRED EMBODIMENTS

The present invention will be described below by way of preferred, but non-limiting, embodiments of the invention. The embodiments presented herein are considered examples of various implementations of the invention, and are not intended to limit or specifically define the overall scope of the invention.

For ease of understanding and to avoid redundancy, like reference numbers refer to the same or similar elements throughout the drawings. Also, the drawings are not necessarily drawn to scale, and the relative dimensions of one or more elements in each of the figures may be exaggerated for clearly. Further, to simplify the drawings, elements (e.g., contact plugs and the like) may be omitted from the illustrations. Still further, while the drawings contain a number of circuit elements and device layers, it will be understood from the nature of electrical circuits that when an element or layer is described as being connected to another element, it can be directly connected the other element or layer, or one or more intervening elements or layers may be present. In contrast, if an element or layer is referred to as being "directly connected to" another element, then no intervening elements or layers are present. Other words used to describe the relationship between elements should be interpreted in a like fashion (e.g., "between" versus "directly between," "adjacent" versus "directly adjacent," "connected" versus "directly connected," etc.).

All specific dimensions, material compositions, conductivity types impurity concentrations, and so on described below are presented as examples, and are not intended to limit the scope of the invention.

Figures 1A, 1B:
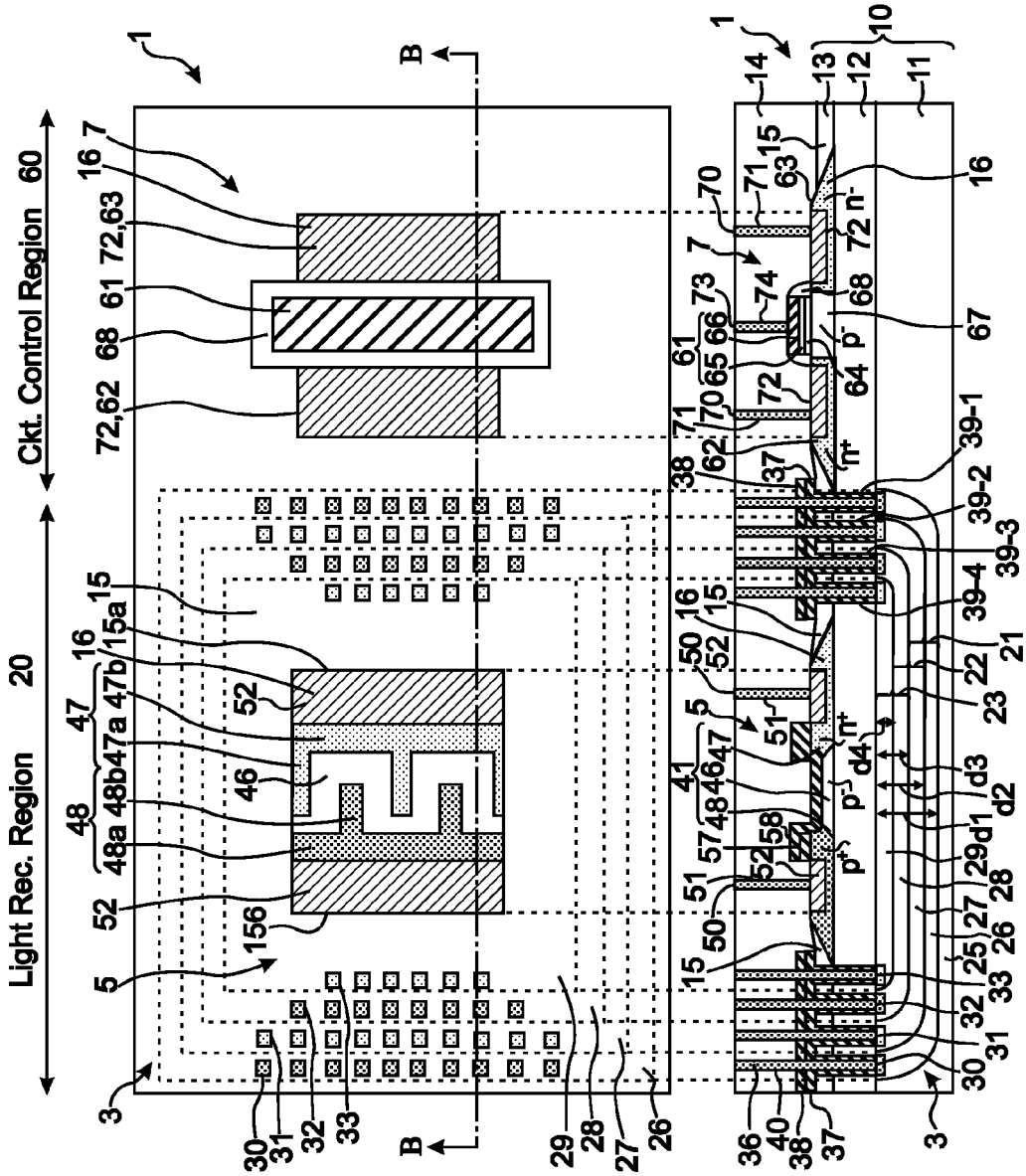
FIGS. 1A and 1B are a top plan view and a cross-sectional view, respectively, illustrating a structure of a semiconductor device according to an embodiment of the present invention.

FIGS. 1A and 1B are a top plan view and a cross-sectional view, respectively, of an optical sensor according to an embodiment of the present invention. The cross-section view of FIG. 1B is taken along line B-B of FIG. 1A. As will be described in detail below, the optical sensor of this example is at least partially characterized in that a visible light sensor is formed on a semiconductor support substrate of a SOI (silicon on insulator) substrate, and an ultraviolet ray sensor is formed above the visible light sensor on an SOI layer.

Referring to FIGS. 1A and 1B, an optical sensor (semiconductor chip) 1 includes SOI substrate 10 containing a light receiving region 20 and a control circuit region 60. A visible light sensor 3 and an ultraviolet ray sensor 5 are formed on the light receiving region 20, and circuit elements such as a transistor 7 are formed on the control circuit region 60.

The SOI substrate 10 includes a semiconductor support substrate 11, a buried oxide film 12 (insulating layer) formed on the semiconductor support substrate 11, and an SOI layer 13 (semiconductor layer) formed on the buried oxide film 12. The SOI layer 13 includes a device isolation regions 15 and a device regions (or active regions) 16. As examples, the semiconductor support substrate 11 may be formed of single-crystalline silicon, the buried oxide film 12 may be formed of a silicon dioxide, and the SOI layer 13 may be formed of single-crystalline silicon. As further examples, the semiconductor support substrate 11 may have a thickness of about 725 µm, the buried oxide film 12 may have a thickness of about 150 nm, and the SOI layer 13 may have thicknesses of about 50 nm and about 35 nm at respective portions thereof as describe later herein.

The visible light sensor 3 is formed on the light receiving region 20 of the semiconductor support substrate 11. The visible light sensor 3 includes a first visible light photodiode 21 configured by a first well 26 and a second well 27, a second visible light photodiode 22 configured by the second well 27 and a third well 28, and a third visible light photodiode 23 configured by the third well 28 and a fourth well 29. In order for the visible light sensor 3 to adequately function as a visible light sensor, at least two visible light photodiodes (e.g., the first visible light photodiode 21 and the second visible light photodiode 22) should be provided. In the present embodiment, three visible light photodiodes are utilized, thus increasing the precision of the visible light sensor 3.

In this example, the semiconductor support substrate 11 is generally doped with p-type impurities as a first conductivity type, and the semiconductor support substrate 11 has a p-type region 25. The p-type region 25 has, for example, an impurity concentration of about $1 \times 10^{15}$ cm$^{-3}$. Moreover, the semiconductor support substrate 11 is doped with n-type impurities as a second conductivity type at a portion thereof to thereby form the first well 26. Furthermore, the second well 27 doped with p-type impurities is formed within the first well 26. Similarly, the third well 28 doped with n-type impurities is formed within the second well 27, and the fourth well 29 doped with p-type impurities is formed within the third well 28. Herein, the semiconductor support substrate 11 doped with p-type impurities may be referred to as a "p-type semiconductor support substrate 11."

As best shown in FIG. 1A, the first well 26 is formed within the light receiving region 20, and an outer circumference thereof defines a square with a side of about 50 µm. Referring to FIG. 1B, a diffusion depth d1 of the first well 26 is about 3.4 µm. The n-type impurity concentration of the first well 26 is about $2 \times 10^{16}$ cm$^{-3}$. Moreover, a plurality of first well high-concentration layers 30, in which n-type impurities having the same conductivity type as the first well 26 are diffused at a concentration which is higher than that of the first well 26, is formed in portions of the first well 26 disposed close to the surface of the semiconductor support substrate 11. The first well high-concentration layers 30 are electrically connected to corresponding contact plugs 36.

As best shown in FIG. 1A, the second well 27 is formed inside the first well 26, and an outer circumference thereof defines a square. Referring to FIG. 1B, a diffusion depth d2 of the second well 27 is about 1.8 µm. The p-type impurity concentration of the second well 27 is about $1 \times 10^{17}$ cm$^{-3}$. Moreover, a plurality of second well high-concentration layers 31, in which p-type impurities having the same conductivity type as the second well 27 are diffused at a concentration which is higher than that of the second well 27, is formed in portions of the second well 27 disposed close to the surface of the semiconductor support substrate 11. The second well high-concentration layers 31 are electrically connected to corresponding contact plugs 36.

As best shown in FIG. 1A, the third well 28 is formed inside the second well 27, and an outer circumference thereof defines a square. Referring to FIG. 1B, a diffusion depth d3 of the third well 28 is about 1.1 µm. The n-type impurity concentration of the third well 28 is about $3 \times 10^{17}$ cm$^{-3}$. Moreover, a plurality of third well high-concentration layers 32, in which n-type impurities having the same conductivity type as the third well 28 are diffused at a concentration which is higher than that of the third well 28, is formed in portions of the third well 28 disposed close to the surface of the semiconductor support substrate 11. The third well high-concentration layers 32 are electrically connected to corresponding contact plugs 36.

As best shown in FIG. 1A, the fourth well 29 is formed inside the third well 28, and an outer circumference thereof defines a square. Referring to FIG. 1B, a diffusion depth d4 of the fourth well 29 is about 0.3 µm. The p-type impurity concentration of the fourth well 29 is about $5 \times 10^{17}$ cm$^{-3}$, which corresponds to a concentration level, generally called low-concentration p-type (p$^-$ type). Moreover, a plurality of fourth well high-concentration layers 33, in which p-type impurities having the same conductivity type as the fourth well 29 are diffused at a concentration which is higher than that of the fourth well 29, is formed in portions of the fourth well 29 disposed close to the surface of the semiconductor support substrate 11. The fourth well high-concentration layers 33 are electrically connected to corresponding contact plugs 36.

Contact holes 39-1 to 39-4 are formed on the first well high-concentration layer 30, the second well high-concentration layer 31, the third well high-concentration layer 32, and the fourth well high-concentration layer 33, respectively, so as to penetrate through the buried insulating film 12 and the device isolation region 15 of the SOI layer 13. The contact holes 39-1 and 39-4 have the same top plan view shape as a corresponding one of the first well high-concentration layer 30, the second well high-concentration layer 31, the third well high-concentration layer 32, and the fourth well high-concentration layer 33 illustrated in FIG. 1A.

An insulating film 37 is provided so as to cover the inner walls of the contact holes 39-1 to 39-4 and upper portions of the device isolation region 15 disposed close to the contact holes 39-1 to 39-4.

Moreover, an insulating film 38 is formed on a portion of the insulating film 37 disposed on the device isolation region 15. The ultraviolet ray sensor 5 of a square configuration is formed on the light receiving region 20 of the SOI layer 13. The perimeter of the ultraviolet ray sensor 5 is surrounded by the device isolation region 15 formed in the SOI layer 13. The ultraviolet ray sensor 5 is formed inside a region where the fourth well 29 of the visible light sensor 3 is formed. Therefore, the visible light sensor 3 is disposed below the ultraviolet ray sensor 5.

The ultraviolet ray sensor 5 includes a UV photodiode 41. The UV photodiode 41 is configured by a p-type low-concentration region 46 formed within the SOI layer 13, an n-type first high-concentration region 47 formed to be adjacent to the low-concentration region 46, and a p-type second high-concentration region 48 of p-type formed to be adjacent to the low-concentration region 46 and opposite the first high-concentration region 47. An impurity concentration of the first high-concentration region 47 and the second high-concentration region 48 is higher than an impurity concentration of the low-concentration region 46.

As best shown in FIG. 1A, the low-concentration region 46 is a region surrounded by the first high-concentration region 47, the second high-concentration region 48, and the device isolation region 15. Moreover, as illustrated in FIG. 1B, a thickness of the SOI layer 13 at a portion thereof where the low-concentration region 46 is formed is smaller than a thickness of the SOI layer 13 at a portion thereof where the first high-concentration region 47 and the second high-concentration region 48 are formed. Specifically, the thickness of the SOI layer 13 at the portion, where the low-concentration region 46 is formed, is set so as to be in the range of about 3 nm to about 36 nm. Such setting of the thickness to be 36 nm or less at this portion may allow for selective reception of ultraviolet light having a wavelength of 400 nm or less.

Moreover, the reason why the thickness is set to be 3 nm or more at this portion is that when the thickness is less than 3 nm, it is practically difficult to absorb variations in the thickness of the SOI layer 13 at this portion. In the example of the present embodiment, the thickness of the SOI layer 13 at the portion, where the low-concentration region 46 is formed, is set to about 35 nm. A p-type impurity concentration of the low-concentration region 46 is about $1 \times 10^{18}$ cm$^{-3}$, which corresponds to a concentration level, generally called low-concentration p-type (p$^-$ type). The first well 26, the second well 27, the third well 28, and the fourth well 29 of the visible light sensor 3 are formed below the low-concentration region 46 of the ultraviolet ray sensor 5.

As best shown in FIG. 1A, the first high-concentration region 47 has a generally comb shape which is formed by a peak portion 47a disposed in contact with one inner side 15a of the device isolation region 15 and a plurality of comb-tooth portions 47b extending from the peak portion 47a toward the other side 15b of the device isolation region 15 opposite the one side 15a. The first high-concentration region 47 of the present embodiment has a generally "E" shaped configuration in which three comb-tooth portions 47b are extended from both end portions and a central portion of the peak portion 47a.

The first high-concentration region 47 is electrically connected to a contact plug 50. Moreover, a thickness of the SOI layer 13 at a portion, where the first high-concentration region 47 is formed, is set so as to be equal to or greater than about 30 nm. This is because when the thickness of the SOI layer 13 at a portion, where the first high-concentration region 47 is formed, is set to be less than 30 nm, a sheet resistance of the first high-concentration region 47 may increase, and thus, an output from the UV photodiode 41 may decrease. Moreover, it is preferable that the thickness of the SOI layer 13 at a portion, where the first high-concentration region 47 is formed, is set to be the same as the thickness of the SOI layer 13 in the control circuit region 60. Such setting of the thickness to be the same as the thickness of the SOI layer 13 in the control circuit region 60 is particularly preferable in view of fabrication efficiency of the first high-concentration region 47.

Furthermore, in this case, it is preferable to set the thickness of the SOI layer 13 at the portion, where the first high-concentration region 47 is formed, so as to be in the range of about 40 nm to about 100 nm. This is because when the thickness of the SOI layer 13 at the portion, where the first high-concentration region 47 is formed, is set to be less than 40 nm, a variation in a threshold voltage of the transistor 7 formed in the SOI layer 13 in the control circuit region 60 becomes to large due to the variation (about ±10 nm) in the thickness of the SOI layer 13 at the time of forming thereof, and thus, it may be difficult to guarantee a stable operation of the transistor.

Moreover, when the thickness of the SOI layer 13, where the first high-concentration region 47 is formed, is set to be greater than 100 nm, the transistor 7 formed on the SOI layer 13 in the control circuit region 60 may not be able to exhibit merits as a SOI transistor. Furthermore, since it is preferable to set the thickness of the SOI layer 13 at the portion, where the first high-concentration region 47 is formed, so as to be the same as the thickness of the SOI layer 13 in the control circuit region 60, the thickness of the SOI layer 13 at this portion is preferably set to be in the range of about 40 nm to about 100 nm.

In the present embodiment, the thickness of the SOI layer 13 at the portion, where the first high-concentration region 47 is formed, is set to about 50 nm. For this reason, as will be understood from FIG. 1B, the thickness of the SOI layer 13 at the portion, where the first high-concentration region 47 is formed, is greater than the thickness of the SOI layer 13 at the portion where the low-concentration region 46 is formed. The n-type impurity concentration of the first high-concentration region 47 is about $1 \times 10^{20}$ cm$^{-3}$, which corresponds to a concentration level, generally called high-concentration n-type (n$^+$ type).

As best shown in FIG. 1A, the second high-concentration region 48 has a generally comb shaped configuration which is formed by a peak portion 48a disposed in contact with the other inner side 15b of the device isolation region 15 and a plurality of comb-tooth portions 48b extending from the peak portion 48a toward the one side 15a of the device isolation region 15 opposite the other side 15b. The second high-concentration region 48 of the present embodiment has a generally "inverted U" shape in which two comb-tooth portions 48b are extended from the peak portion 48a.

The second high-concentration region 48 is electrically connected to the contact plug 50. Moreover, as illustrated in FIG. 1B, a thickness of the SOI layer 13 at a portion, where the second high-concentration region 48 is formed, is set so as to be greater than the thickness of the SOI layer 13 at the portion where the low-concentration region 46 is formed. The same thickness preference as described above in connection with the first high-concentration region 47 is applied as the thickness preference of the SOI layer 13 at the portion where the second high-concentration region 48 is formed. Specifically, it is preferred to set the thickness of the SOI layer 13 at a portion, where the second high-concentration region 48 is formed, so as to be equal to or greater than 30 mm. Preferably, the thickness is the same as the thickness of the SOI layer 13 in the control circuit region 60. More preferably, the thickness is in the range of about 40 nm to about 100 nm. In the present embodiment, it is set to about 50 nm. The p-type impurity concentration of the second high-concentration region 48 is about $1 \times 10^{20}$ cm$^{-3}$, which corresponds to a concentration level, generally called a high-concentration p-type (p$^+$ type).

In the present embodiment, a silicide region 52 is formed on a surface layer of the first high-concentration region 47 and the second high-concentration region 48. The silicide region 52 is formed, for example, of cobalt silicide (CoSi$_2$) or titanium silicide (TiSi$_2$). Therefore, in the present embodiment, the contact plug 50 is formed on the silicide region 52.

Since the first high-concentration region 47 and the second high-concentration region 48 are connected to the contact plug 50 via the silicide region 52, it is possible to decrease a contact resistance. Moreover, in a case where it is not necessary to consider the contact resistance, the silicide region 52 may not be provided, and in this case, the contact plug 50 is formed on the first high-concentration region 47 and the second high-concentration region 48.

An insulating film 57 is formed at a region disposed closer to a channel region than the silicide region 52 on the first high-concentration region 47 and the second high-concentration region 48.

An insulating film 58 is formed so as to extend from the channel region 46 to the insulating film 57. The transistor 7 is formed on the control circuit region 60 of the SOI layer 13. The transistor 7 includes a gate electrode 61, a source region 62, and a drain region 63. The perimeter of the transistor 7 is surrounded by the device isolation region 15 formed on the SOI layer 13. Although the control circuit region 60 is a region on which circuits, e.g., for amplifying and calculating a photocurrent value detected by the visible light sensor 3 and the ultraviolet ray sensor 5 are formed, other circuits for other purposes may be formed.

The source region 62 and the drain region 63 are formed within the SOI layer 13 so as to oppose each other with the channel region 67 disposed therebetween. The source region 62 and the drain region 63 are a high-concentration region of n-type as the second conductivity type, and the channel region 67 is a low-concentration region of p-type as the first conductivity type. An impurity concentration of the source region 62 and the drain region 63 is higher than an impurity concentration of the channel region 67.

Moreover, a thickness of the SOI layer 13 at a portion where the source region 62, the drain region 63 and the channel region 67 are formed is about 50 nm, which is the same as the thickness of the SOI layer 13 at the portion where the first high-concentration region 47 and the second high-concentration region 48 are formed. By setting the thickness of the SOI layer 13 at the portion where the source region 62, the drain region 63, and the channel region 67 are formed so as to be equal to or smaller than 100 nm, the transistor 7 becomes able to exhibit the merits as a SOI transistor. Moreover, by setting the thickness at this region to be equal to or smaller than 50 nm, the transistor 7 can be configured to have the characteristics of a full depletion-type transistor.

In the present embodiment, a silicide region 72 is formed on a surface layer of the source region 62 and the drain region 63. The silicide region 72 is formed, for example, of cobalt silicide ($CoSi_2$) or titanium silicide ($TiSi_2$). Therefore, in the present embodiment, a contact plug 70 is formed on the silicide region 72. Since the source region 62 and the drain region 63 are connected to the contact plug 70 via the silicide region 72, it is possible to decrease a contact resistance.

Moreover, the silicide region 72 may not be provided, and in this case, the contact plug 70 is formed on the source region 62 and the drain region 63. The gate electrode 61 is formed on the channel region 67 of the SOI layer 13 via a gate insulating film 64.

The gate insulating film 64 is formed on the channel region 67 of the SOI layer 13. The gate insulating film 64 is formed of silicon dioxide. The gate electrode 61 is formed above the gate insulating film 64. In the present embodiment, the gate electrode 61 has a stack structure of a polysilicon polycrystalline silicon) layer 65 and a silicide layer 66. The silicide layer 66 is formed, for example, of cobalt silicide ($CoSi_2$) or titanium silicide ($TiSi_2$). Therefore, in the present embodiment, a contact plug 74 is formed on the silicide layer 66. Since the gate electrode 61 is connected to the contact plug 74 via the silicide layer 66, it is possible to decrease a contact resistance. Moreover, the silicide region 66 may not be provided, and in this case, the contact plug 73 is formed on the polysilicon layer 65. The gate electrode 61 has a thickness of about 200 nm.

A side wall 68 is formed on a lateral surface of the gate electrode 61 and the gate insulating film 64. The side wall 68 is formed of silicon dioxide. A description of the visible light sensor 3, the ultraviolet ray sensor 5, and the transistor 7, formed on the light receiving region 20 and the control circuit region 60 of the SOI substrate 10 has been provided hereinabove.

In addition to the configuration described above, an intermediate insulating film 14 is formed on the SOI layer 13 via the insulating films 37, 38, 57, and 58. The intermediate insulating film 14 may be formed of silicon dioxide.

Contact holes 40 are formed on the first well high-concentration layer 30, the second well high-concentration layer 31, the third well high-concentration layer 32, and the fourth well high-concentration layer 33 so as to penetrate through the insulating film 37, the insulating film 38, and the intermediate insulating film 14. Moreover, the contact plug 36 is filled in the contact holes 40. The contact plug 36 is formed of a conductive material such as tungsten.

Contact holes 51 and 71 are formed on the silicide regions 52 and 72, respectively, so as to penetrate through the intermediate insulating film 14. Moreover, the contact plugs 50 and 70 are filled in the contact holes 51 and 71, respectively. The contact plugs 50 and 70 are formed of a conductive material such as tungsten.

The contact hole 74 is formed on the silicide layer 66 so as to penetrate through the intermediate insulating film 14. The contact plug 73 is filled in the contact hole 74. The contact plug 73 is formed of a conductive material such as tungsten. Moreover, a desired wiring pattern is formed on the intermediate insulating film 14, so that the contact plugs 36, 50, 70, and 73 are electrically connected to the wiring pattern.

Fabrication of the optical sensor of FIGS. 1A and 1B will now be described with reference to the cross-section views of FIGS. 2A through 9 according to an embodiment of the present invention. Each of the cross-sectional views illustrated in FIGS. 2A through 9 is relative line B-B in FIG. 1A. Again, all specific dimensions, material compositions, conductivity types impurity concentrations, and so on described below are presented as examples, and are not intended to limit the scope of the invention.

Figure 2A:
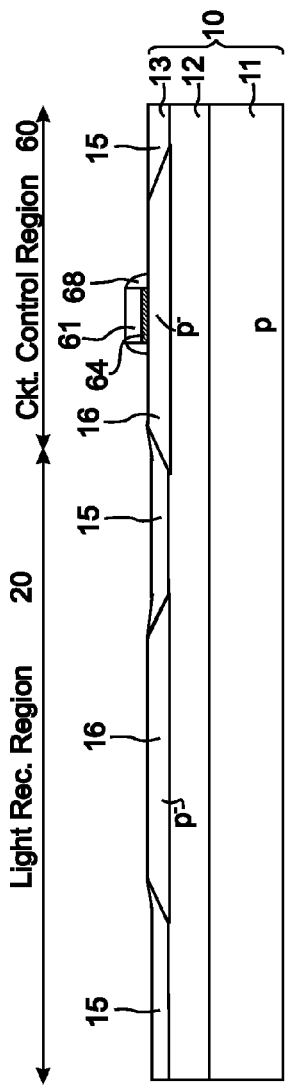
FIGS. 2A to 2C are cross-sectional views (relative to line B-B of FIG. 1B) for use the fabrication of the semiconductor device according to the embodiment of the present invention.

First, as illustrated in FIG. 2A, a SOI substrate 10 is prepared. The SOI substrate 10 is formed by, e.g., a bonding method, a SIMOX method, or the like, and has a configuration in which a buried oxide film 12 as an insulating layer is formed on a semiconductor support substrate 11, and a SOI layer 13 is formed on the buried oxide film 12. The semiconductor support substrate 11 is formed of single-crystalline silicon, the buried oxide film 12 is formed of a silicon dioxide, and the SOI layer 13 is formed of single-crystalline silicon.

The semiconductor support substrate 11 has a thickness of about 725 μm, the buried oxide film 12 has a thickness of about 150 nm, and the SOI layer 13 has a thickness of about 50 nm. Moreover, the semiconductor support substrate 11 is implanted with p-type impurities as a first conductivity type, and an impurity concentration thereof is about $1\times10^{15}$ $cm^{-3}$. Furthermore, the SOI layer 13 is doped with p-type impurities as the first conductivity type at a concentration (for example, about $1\times10^{15}$ $cm^{-3}$), which corresponds to a concentration level, generally called low-concentration p-type (p⁻ type).

The SOI substrate 10 includes a light receiving region 20, on which a visible light sensor 3 and an ultraviolet ray sensor 5 are formed, and a control circuit region 60, on which circuit elements such as a transistor 7 are formed. A device isolation region 15 formed of a silicon dioxide by a LOCOS method, an STI method, or the like, is formed on the light receiving region 20 and the control circuit region 60 of the SOI layer 13.

In this way, a device region 16 surrounded by the device isolation region 15 is defined in the light receiving region 20 and the control circuit region 60 of the SOI layer 13. Moreover, a gate electrode 61 is formed on the device region 16 of the control circuit region 60 via a gate insulating film 64. The gate electrode 61 is formed of polysilicon. A side wall 68 is formed on a lateral surface of the gate insulating film 64 and the gate electrode 61. The side wall 68 is formed of silicon dioxide.

A process of forming first to fourth wells 26 to 29 constituting the visible light sensor 3 on the light receiving region 20 of the semiconductor support substrate 11 will be provided with reference to FIGS. 2B, 2C, 3A, and 3B.

Figure 2B:
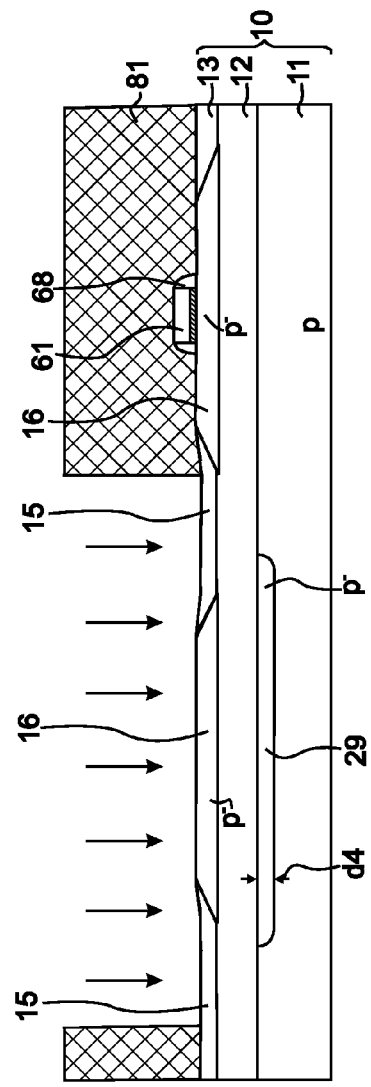

First, as illustrated in FIG. 2B, a fourth well 29 is formed. Specifically, first, a resist pattern 81 is formed on the SOI layer 13. The resist pattern 81 is a mask pattern configured to expose the device region 16 of the light receiving region 20 and a portion of the device isolation region 15 disposed close to the device region 16 while covering other regions. Thereafter, using the resist pattern 81 as a mask, the semiconductor support substrate 11 is ion-implanted with impurities (e.g., boron) of p-type as a first conductivity type (ion implantation). As a result, a fourth well 29 of p-type having a diffusion depth d4 of about 0.3 μm is formed on the light receiving region 20 of the semiconductor support substrate 11. The p-type impurity concentration of the fourth well 29 is about $5 \times 10^{17}$ cm$^{-3}$, which corresponds to a concentration level, generally called low-concentration p-type (p$^-$ type). Upon completion of implantation of the p-type impurities, the resist pattern 81 is removed.

Figure 2C:
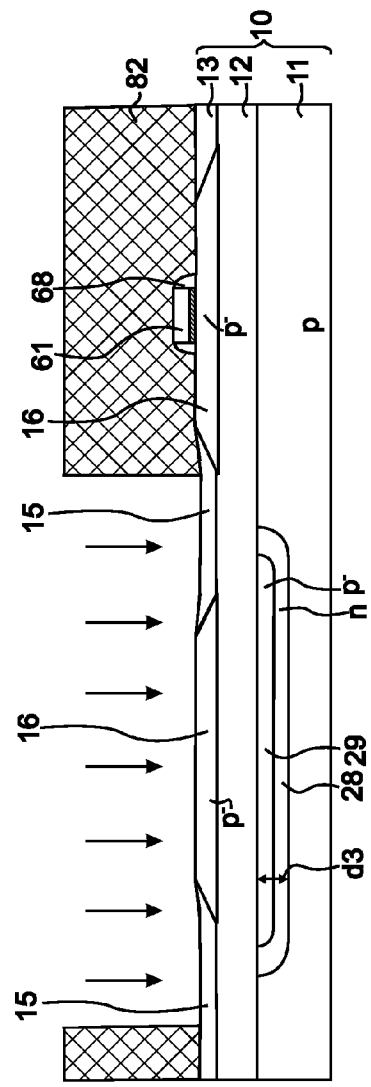

Next, as illustrated in FIG. 2C, a third well 28 is formed. Specifically, first, a resist pattern 82 is formed on the SOI layer 13. The resist pattern 82 is a mask pattern configured to expose the device region 16 of the light receiving region 20 and a portion of the device isolation region 15 disposed close to the device region 16 while covering other regions. The resist pattern 82 is configured to be able to expose a region wider than that of the fourth well 29. Thereafter, using the resist pattern 82 as a mask, the semiconductor support substrate 11 is ion-implanted with impurities (e.g., phosphor) of n-type as a second conductivity type.

During the ion implantation, the implantation energy is adjusted so that the n-type impurities can be diffused to a region deeper than the fourth well 29. As a result, a third well 28 of n-type having a diffusion depth d3 of about 1.1 μm and an n-type impurity concentration of about $3 \times 10^{17}$ cm$^{-3}$ is formed within the light receiving region 20 of the semiconductor support substrate 11. The third well 28 has a size greater than that of the fourth well 29 so as to surround the fourth well 29 within the semiconductor support substrate 11. Upon completion of the implantation of the n-type impurities, the resist pattern 82 is removed.

Next, as illustrated in FIG. 3A, a second well 27 is formed. Specifically, first, a resist pattern 83 is formed on the SOI layer 13. The resist pattern 83 is a mask pattern configured to expose the device region 16 of the light receiving region 20 and a portion of the device isolation region 15 disposed close to the device region 16 while covering other regions. The resist pattern 83 is configured to be able to expose a region wider than that of the third well 28. Thereafter, using the resist pattern 83 as a mask, the semiconductor support substrate 11 is ion-implanted with impurities (e.g., boron) of p-type as the first conductivity type. During the ion implantation, the implantation energy is adjusted so that the p-type impurities can be diffused to a region deeper than the third well 28. As a result, a second well 27 of p-type having a diffusion depth d2 of about 1.8 μm and a p-type impurity concentration of about $1 \times 10^{17}$ cm$^{-3}$ is formed within the light receiving region 20 of the semiconductor support substrate 11. The second well 27 has a size greater than that of the third well 28 so as to surround the third well 28 within the semiconductor support substrate 11. Upon completion of the implantation of the p-type impurities, the resist pattern 83 is removed.

Next, as illustrated in FIG. 3B, a first well 26 is formed. Specifically, first, a resist pattern 84 is formed on the SOI layer 13. The resist pattern 84 is a mask pattern configured to expose the device region 16 of the light receiving region 20 and a portion of the device isolation region 15 disposed close to the device region 16 while covering other regions. The resist pattern 84 is configured to be able to expose a region wider than that of the second well 27. Thereafter, using the resist pattern 84 as a mask, the semiconductor support substrate 11 is ion-implanted with impurities (e.g., phosphor) of n-type as the second conductivity type. During the ion implantation, the implantation energy is adjusted so that the n-type impurities can be diffused to a region deeper than the second well 27. As a result, a first well 26 of n-type having a diffusion depth d1 of about 3.4 μm and an n-type impurity concentration of about $2 \times 10^{16}$ cm$^{-3}$ is formed within the light receiving region 20 of the semiconductor support substrate 11. The first well 26 has a size greater than that of the second well 27 so as to surround the second well 27 within the semiconductor support substrate 11. Upon completion of the implantation of the n-type impurities, the resist pattern 84 is removed.

In this way, the first to fourth wells 26 to 29 constituting the visible light sensor 3 are formed on the light receiving region 20 of the semiconductor support substrate 11.

Next, a process of forming first to fourth well high-concentration layers 30 to 33 on a surface layer of the semiconductor support substrate 11 of the first to fourth wells 26 to 29 will be provided with reference to FIGS. 3C, 4A, 4B, and 4C. The first to fourth well high-concentration layers 30 to 33 become electrodes for the first to fourth wells 26 to 29.

First, as illustrated in FIG. 3C, contact holes 39-1 and 39-3 are formed on a surface layer region of the semiconductor support substrate 11 of the first well and the third well 28. Specifically, first, a resist pattern 85 is formed on the SOI layer 13. The resist pattern 85 is a mask pattern configured to expose a plurality of portions of the surface of the SOI layer 13 disposed above a region of the surface of the semiconductor support substrate 11, to which the first well 26 and the third well 28, being an n-type well, are extended, while covering other regions. Thereafter, using the resist pattern 85 as a mask, portions of the SOI layer 13 and the buried oxide film 12 are selectively etched to be removed. As a result, a plurality of contact holes 39-1 and 39-3 are formed on the SOI layer 13 and the buried oxide film 12, and a plurality of portions of the region of the semiconductor support substrate 11, to which the first well 26 and the third well 28 are extended, are exposed via the contact holes 39-1 and 39-3.

Figure 4A:
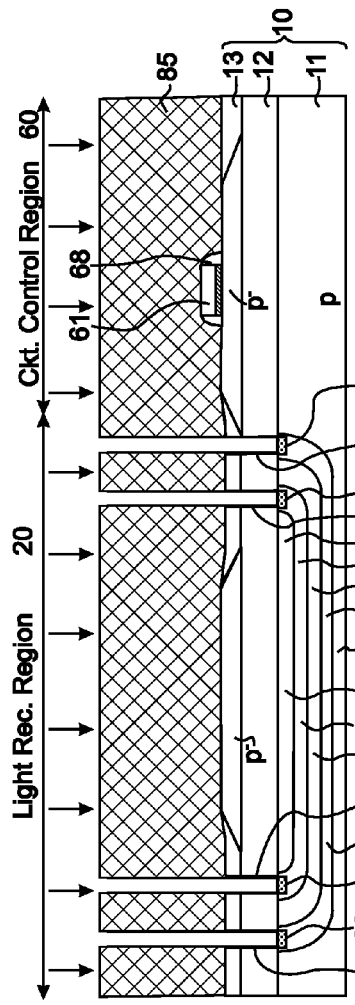
FIGS. 4A to 4C are cross-sectional views (relative to line B-B of FIG. 1B) for use the fabrication of the semiconductor device according to the embodiment of the present invention.

Next, as illustrated in FIG. 4A, a first well high-concentration layer 30 and a third well high-concentration layer 32 are formed on the surface layer region of the semiconductor support substrate 11 of the first well 26 and the third well 28. Specifically, using the resist pattern 85 as a mask, the semiconductor support substrate 11 is ion-implanted with impurities (e.g., arsenic) of n-type as the second conductivity type. During the ion implantation, the implantation energy is adjusted so that the n-type impurities can be diffused to the surface layer region of the semiconductor support substrate 11 of the first well 26 and the third well 28. As a result, a plurality of first well high-concentration layers 30 is formed on portions of the region (i.e., the surface layer region of the semiconductor support substrate 11) of the surface of the semiconductor support substrate 11 to which the first well 26 is extended.

Similarly, a plurality of third well high-concentration layers 32 is formed on portions of the region (i.e., the surface layer region of the semiconductor support substrate 11) of the surface of the semiconductor support substrate 11 to which the third well 28 is extended. The first well high-concentration layer 30 and the third well high-concentration layer 32 have a planar arrangement as illustrated in FIG. 1A. In the first well high-concentration layer 30 and the third well high-concentration layer 32, n-type impurities are diffused at a high concentration (n⁺ type), and a concentration thereof is about $1 \times 10^{20}$ cm$^{-3}$. Upon completion of the implantation of the n-type impurities, the resist pattern 85 is removed.

Figure 4B:
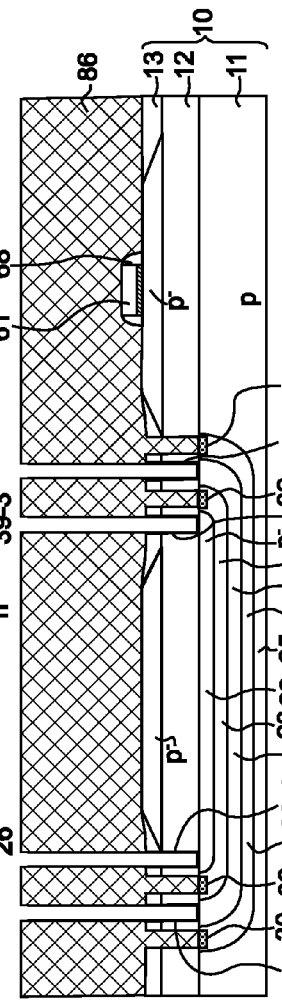

Next, as illustrated in FIG. 4B, contact holes 39-2 and 39-4. Specifically, first, a resist pattern 86 is formed on the SOI layer 13. The resist pattern 86 is a mask pattern configured to expose a plurality of portions of the surface of the SOI layer 13 disposed above a region of the surface of the semiconductor support substrate 11, to which the second well 27 and the fourth well 29, being a p-type well, are extended, while covering other regions. Thereafter, using the resist pattern 86 as a mask, portions of the SOI layer 13 and the buried oxide film 12 are selectively etched to be removed. As a result, a plurality of contact holes 39-2 and 39-4 are formed on the SOI layer 13 and the buried oxide film 12, and a plurality of portions of the region of the semiconductor support substrate 11, to which the second well 27 and the fourth well 29 are extended, are exposed via the contact holes 39-2 and 39-4.

Figure 4C:
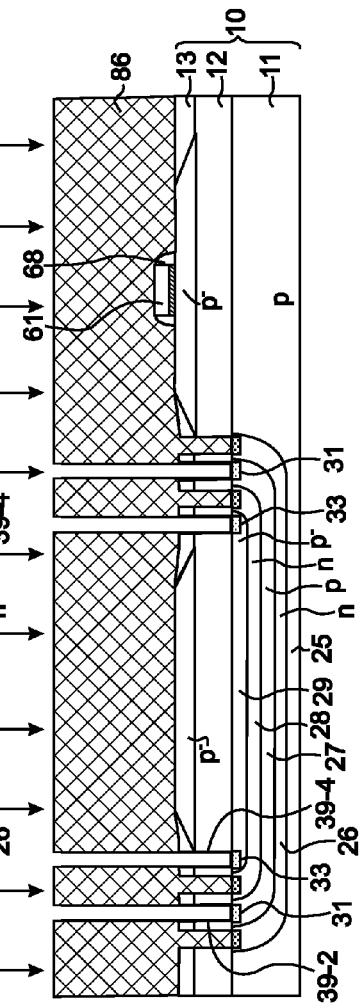

Next, as illustrated in FIG. 4C, a second well high-concentration layer 31 and a fourth well high-concentration layer 33 are formed on the surface layer region of the semiconductor support substrate 11 of the second well 27 and the fourth well 29. Specifically, using the resist pattern 86 as a mask, the semiconductor support substrate 11 is ion-implanted with impurities (e.g., boron difluoride) of p-type as the first conductivity type. During the ion implantation, the implantation energy is adjusted so that the p-type impurities can be diffused to the surface layer region of the semiconductor support substrate 11 of the second well 27 and the fourth well 29. As a result, a plurality of second well high-concentration layers 31 is formed on portions of the region (i.e., the surface layer region of the semiconductor support substrate 11) of the surface of the semiconductor support substrate 11 to which the second well 27 is extended.

Similarly, a plurality of fourth well high-concentration layers 33 is formed on portions of the region (i.e., the surface layer region of the semiconductor support substrate 11) of the surface of the semiconductor support substrate 11 to which the fourth well 29 is extended. The second well high-concentration layer 31 and the fourth well high-concentration layer 33 have a planar arrangement as illustrated in FIG. 1A. In the second well high-concentration layer 31 and the fourth well high-concentration layer 33, p-type impurities are diffused at a high concentration (p⁺ type), and a concentration thereof is about $1 \times 10^{20}$ cm$^{-3}$. Upon completion of the implantation of the p-type impurities, the resist pattern 86 is removed.

Next, a process of forming a diffusion region within the SOI layer 13 of the light receiving region 20 and the control circuit region 60 will be described with reference to FIGS. 5A, 5B, and 6A. The diffusion region forms a portion of the ultraviolet ray sensor 5 in the light receiving region 20, while forming a portion of the transistor 7 in the control circuit region 60. Moreover, although the present embodiment illustrates a process step for forming an n-type MOS transistor as the transistor 7, a p-type MOS transistor may be simultaneously fabricated by an ordinary method.

First, as illustrated in FIG. 5A, n-type high-concentration impurity regions, that is, a first high-concentration region 47, a source region 62, and a drain region 63, are formed within the SOI layer 13. Specifically, first, an insulating film 95 having a thickness of about 10 nm is formed. The insulating film 95 is a film for preventing lowering of an impurity concentration due to outward diffusion during heat treatment in order to suppress contamination by metal or the like at the time of ion implantation. The insulating film 95 is formed, for example, of silicon dioxide, and may be formed by a CVD method. Next, a resist pattern 87 is formed on the SOI layer 13.

The resist pattern 87 is a mask pattern configured to expose a portion of the light receiving region 20 and the control circuit region 60 while covering other regions. Thereafter, using the resist pattern 87, the gate electrode 61, and the side wall 68 as a mask, the SOI layer 13 is ion-implanted with impurities (e.g., phosphor) of n-type as the second conductivity type. As a result, a first high-concentration diffusion region 47 is formed in the device region 16 of the light receiving region 20, while a source region 62 and a drain region 63 are formed in the device region 16 of the control circuit region 60. Moreover, a region of the device region 16 of the control circuit region 60 being sandwiched between the source region 62 and the drain region 53 becomes a channel region 67. The first high-concentration diffusion region 47 has a top plan view shape obtained when the first high-concentration diffusion region 47 illustrated in FIG. 1A and the silicide region 52 adjacent to the first high-concentration diffusion region 47 are put together. The source region 62 and the drain region 63 have a top plan view shape as illustrated in FIG. 1A.

Since FIG. 1A illustrates a final structure, the silicide regions 52 and 72, which are formed, in later process steps, on the surface of the first high-concentration region 47, the source region 62, and the drain region 63, are also illustrated in the drawing figure. However, regions corresponding to the silicide regions 52 and 72 of FIG. 1A are not present at the present process step. In the first high-concentration region 47, the source region 62, and the drain region 63, n-type impurities are diffused at a high concentration, and a concentration thereof is about $1 \times 10^{20}$ cm$^{-3}$. Upon completion of the implantation of the n-type impurities, the resist pattern 87 is removed.

Next, as illustrated in FIG. 5B, a p-type high-concentration impurity region, that is, a second high-concentration region 48 is formed within the SOI layer 13. Specifically, first, a resist pattern 88 is formed on the SOI layer 13. The resist pattern 88 is a mask pattern configured to expose a portion of the light receiving region 20 while covering other regions. Thereafter, using the resist pattern 88 as a mask, the SOI layer 13 is ion-implanted with impurities (e.g., boron) of p-type as the first conductivity type. As a result, a second high-concentration diffusion region 48 is formed in the device region 16 of the light receiving region 20.

Moreover, a region of the device region 16 of the light receiving region 20 being sandwiched between the first high-concentration diffusion region 47 and the second high-concentration diffusion region 48 becomes a low-concentration region 46. The second high-concentration diffusion region 48 has a top plan view shape obtained when the second high-concentration diffusion region 48 illustrated in FIG. 1A and the silicide region 52 adjacent to the second high-concentration diffusion region 48 are put together. The low-concentration region 46 has a top plan view shape as illustrated in FIG.

1A. Since FIG. 1A illustrates a final structure, the silicide region 52, which is formed, in a later process step, on the surface of the second high-concentration region 48, is also illustrated in the drawing figure. However, a region corresponding to the silicide region 52 of FIG. 1A is not present at the present process step. In the second high-concentration region 48, p-type impurities are diffused at a high concentration, and a concentration thereof is about $1 \times 10^{20}$ cm$^{-3}$. Upon completion of the implantation of the p-type impurities, the resist pattern 88 is removed.

Figure 6:
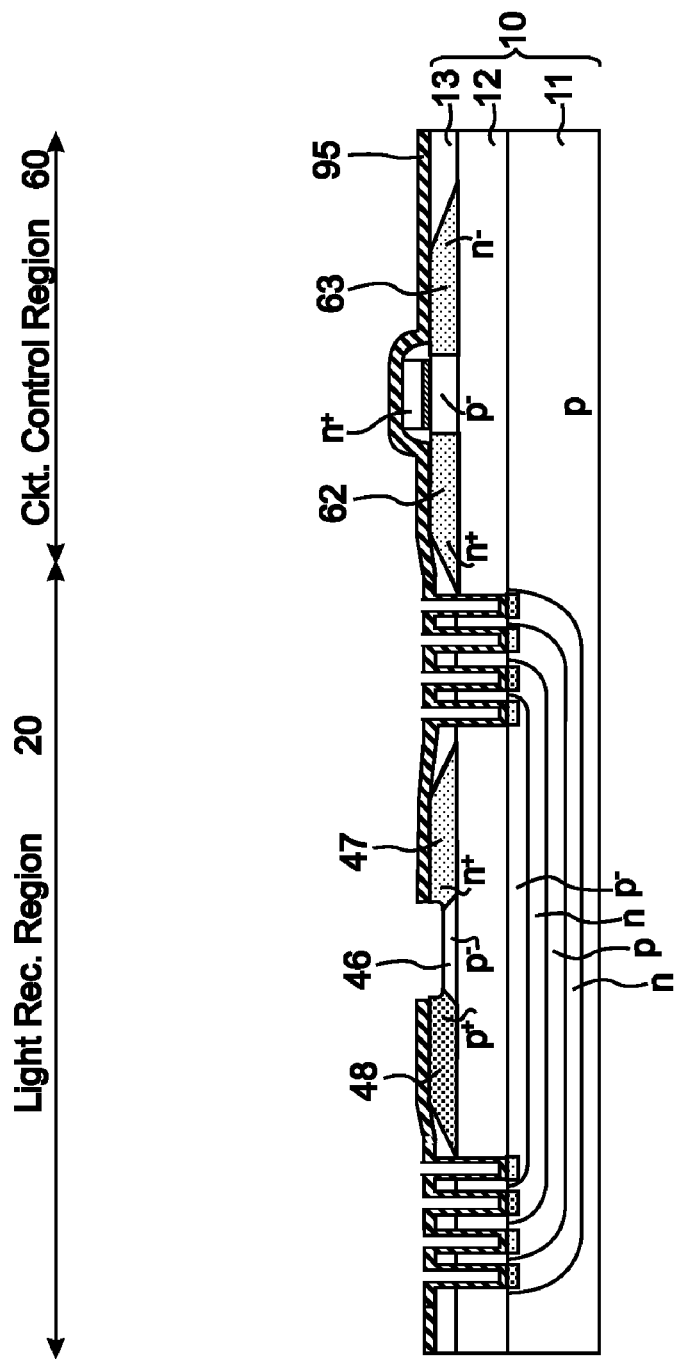
FIG. 6 is a cross-sectional view (relative to line B-B of FIG. 1B) for use the fabrication of the semiconductor device according to the embodiment of the present invention.

Next, as illustrated in FIG. 6, the n- and p-type impurities implanted at the process steps illustrated in FIGS. 5A and 5B are activated. Specifically, heat treatment is carried out at temperature of 1000° C. by a rapid thermal annealing (RTA) method. As a result, impurities within the first high-concentration region 47, the second high-concentration region 48, the source region 62, and the drain region 63 are activated.

Next, a process of adjusting the thickness of the SOI layer 13 on the low-concentration region 46 of the light receiving region 20 will be described with reference to FIG. 7A. First, a resist pattern 89 is formed on the insulating film 95. The resist pattern 89 is a mask pattern configured to expose the insulating film 95 on the low-concentration region 46 of the light receiving region 20 while covering other regions. Thereafter, an etching is carried out using the resist pattern 89 as a mask to thereby remove a portion of the SOI layer 13 and the insulating film 95. As a result, the thickness of the SOI layer 13 on the low-concentration region 46 is controlled so as to be in the range of about 3 nm to about 36 nm. In the present embodiment, the thickness of the SOI layer 13 on the low-concentration region 46 is set to about 35 nm. Upon completion of the etching, the resist pattern 89 is removed.

Next, a process of forming a silicide (silicide regions 52 and 72 and a silicide layer 66) in portions of the light receiving region 20 and the control circuit region 60 will be provided with reference to FIGS. 7B, 8A, 8B, and 9. This process of forming the silicide is performed in order to decrease a resistance of a region in which the silicide is formed. Therefore, the silicide may not be formed if low-resistance characteristics are not desired.

Figure 8A:
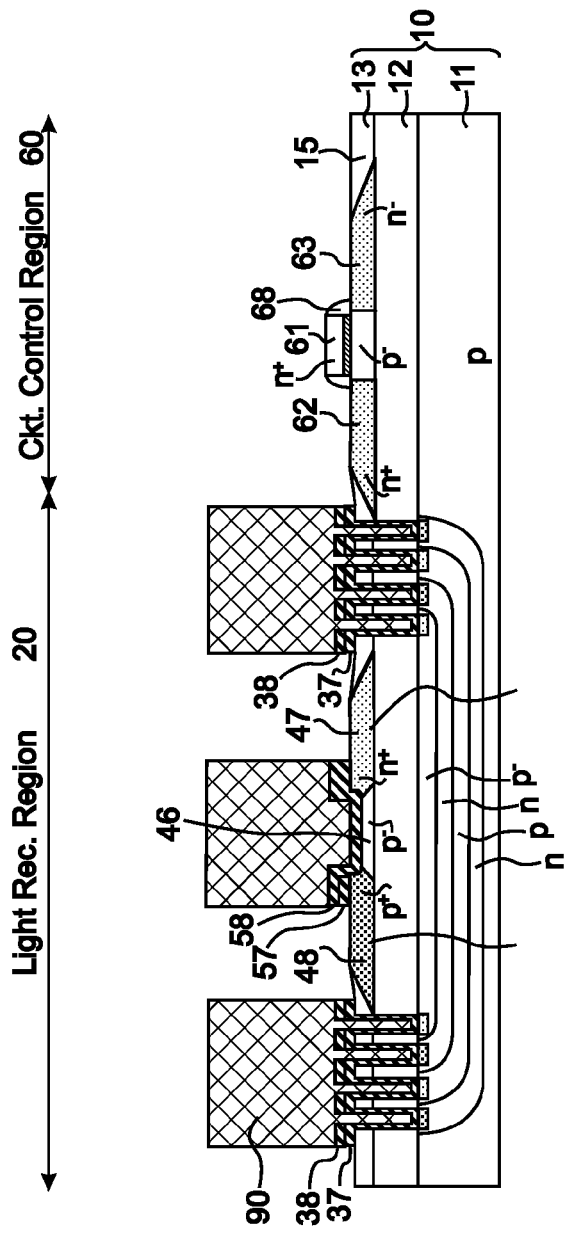
FIGS. 8A and 8B are cross-sectional views (relative to line B-B of FIG. 1B) for use the fabrication of the semiconductor device according to the embodiment of the present invention.

First, as illustrated in FIG. 7B, an insulating film 96 having a thickness of about 40 nm is formed on the insulating film 95. The insulating film 96 is formed, for example, of silicon dioxide, and may be formed by e.g., a CVD method. Next, as illustrated in FIG. 8A, portions of the insulating films 95 and 96 corresponding to a region where silicide is to be formed are selectively removed. Specifically, first, a resist pattern 90 is formed on the insulating film 96. The resist pattern 90 is a mask pattern configured to expose portions of the insulating film 96 disposed above the high-concentration region 47 and the second high-concentration region 48 and the entire surface of the insulating film 96 in the control circuit region 60.

Thereafter, an etching is carried out using the resist pattern 90 as a mask to thereby selectively remove the insulating films 95 and 96. As a result, the first high-concentration region 47, the second high-concentration region 48, the source region 62, the drain region 63, and the gate electrode 61 are exposed. Moreover, remaining portions of the insulating films 95 and 96 become the insulating films 37 and 38, respectively, at portions disposed close to the contact holes 39-1 to 39-4, while becoming insulating films 57 and 58, respectively, at portions disposed on the low-concentration region 46.

Figure 8B:
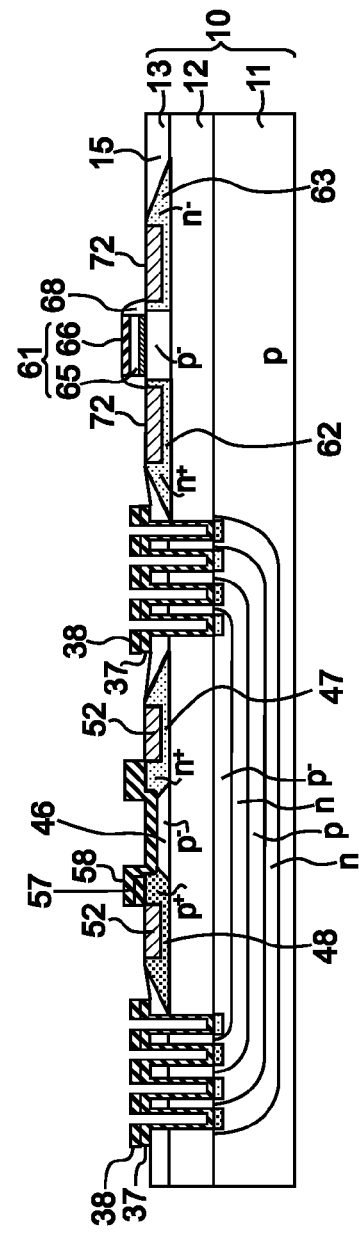

Next, as illustrated in FIG. 8B, silicide regions 52 and 72 and a silicide layer 66 are formed. Specifically, first, the resist pattern 90 is removed. Next, a film of metal (e.g., cobalt or titanium) for forming a silicide is formed thereon. In the present embodiment, a cobalt film is formed by a sputtering method. Thereafter, heat treatment is performed, so that the surface layer regions of the first high-concentration region 47, the second high-concentration region 48, the source region 62, the drain region 63, and the gate electrode 61 are silicidated. As a result, a silicide region 52 is formed on thickness first high-concentration region 47 and the second high-concentration region 48, a silicide region 72 is formed on the source region 62 and the drain region 63, and a silicide layer 66 is formed on the gate electrode 61.

Moreover, a portion of the gate electrode 61, which was not silicidated, becomes a polysilicon layer 65. Upon completion of the heat treatment, portions of the cobalt film, which was not silicidated, are selectively removed. In this manner, the present embodiment employs a so-called Salicide (self-aligned silicide) process that forms the silicide region in a self-aligned manner.

Figure 9:
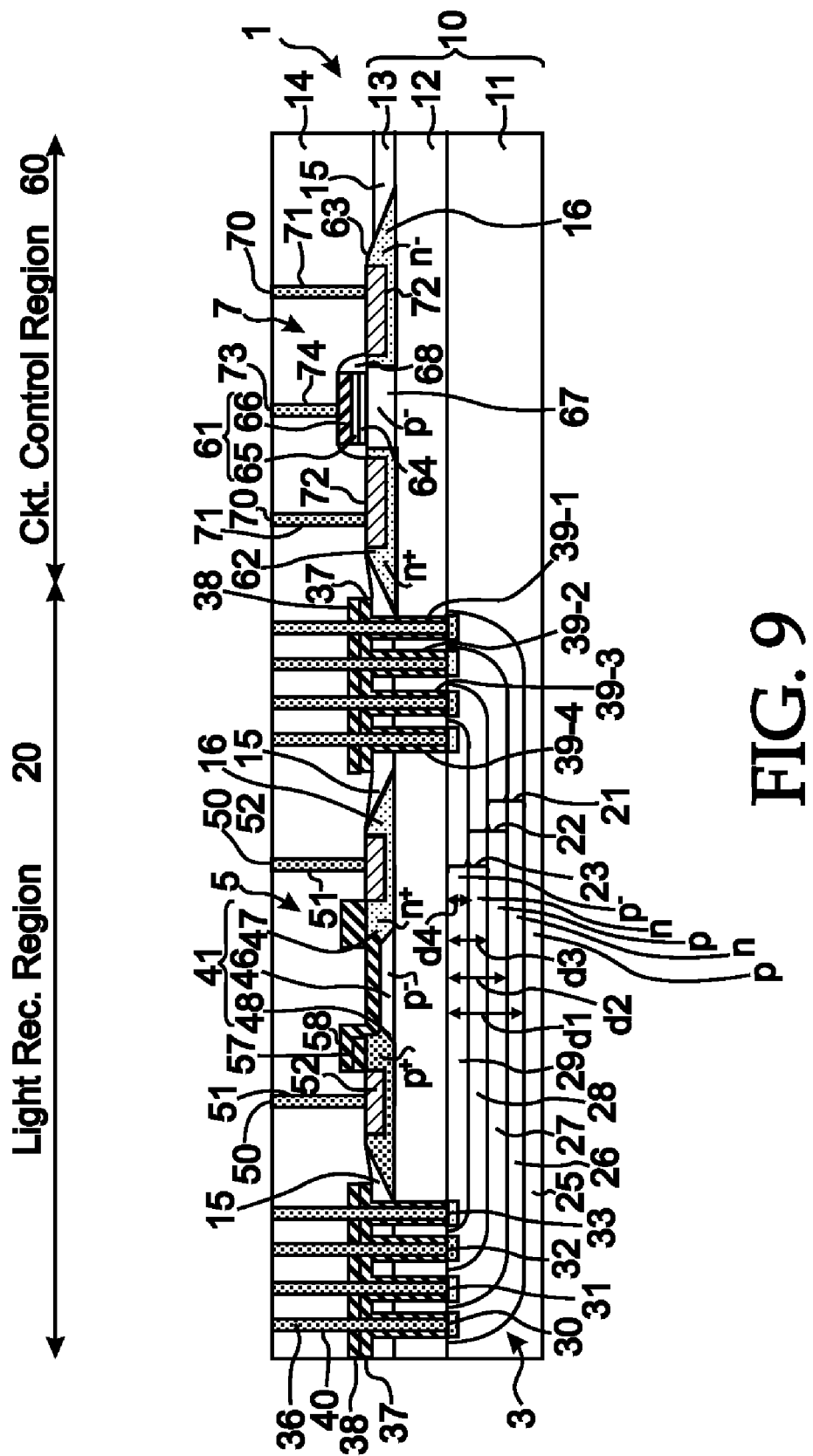
FIG. 9 is a cross-sectional view (relative to line B-B of FIG. 1B) for use the fabrication of the semiconductor device according to the embodiment of the present invention.

Next, a process of forming a contact plug (contact plugs 36, 50, 70, and 73) will be described with reference to FIG. 9. A contact plug is used for electrically connecting the diffusion regions and the gate electrode 61 formed on the semiconductor support substrate 11 and the SOI layer 13 to an upper wiring layer. Specifically, first, an intermediate insulating film 14 having a thickness of about 900 nm is formed and planarized by a CMP (chemical mechanical polishing) method. The intermediate insulating film 14 is formed, for example, of silicon dioxide, and may be formed by e.g., a CVD method.

Next, a resist pattern configured to expose portions, where the contact plug is to be formed, is formed. Next, an etching is carried out using the resist pattern as a mask, so that contact holes are formed so as to expose a portion of the surface of the first to fourth well high-concentration layer 30 to 33, the silicide regions 52 and 72, and the silicide layer 66.

That is, a contact hole 40 exposes a portion of the surface of the first to fourth well high-concentration layers 30 to 33 and penetrates through the insulating films 37 and 38 and the intermediate insulating film 14. A contact hole 51 exposes a portion of the surface of the silicide region 52 and penetrates through the intermediate insulating film 14. A contact hole 71 exposes a portion of the surface of the silicide region 72 and penetrates through the intermediate insulating film 14. A contact hole 74 exposes a portion of the surface of the silicide layer 66 and penetrates through the intermediate insulating film 14. Next, a conductive film of tungsten, aluminum, or the like is filled in the contact holes to be planarized. As a result, contact plugs 36, 50, 70, and 73 are formed. Thereafter, a process step for forming a wiring layer is carried out in an ordinary manner.

Through the above-described process steps, the optical sensor according to the embodiment of the present invention is fabricated.

Figure 10A:
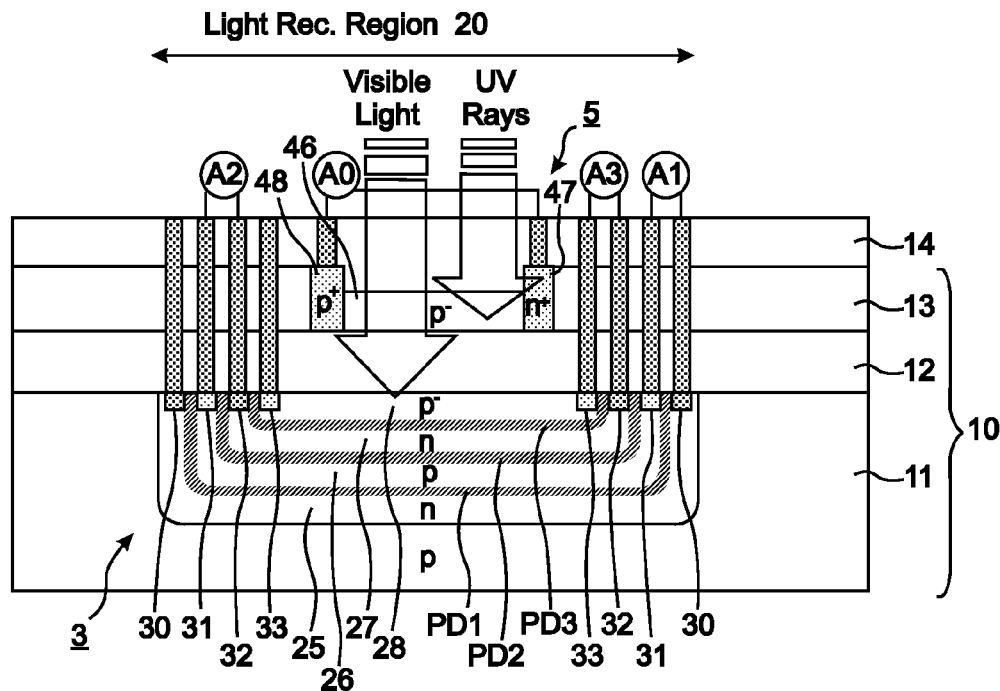
FIG. 10A a schematic view for use in describing an operation of the semiconductor device according to the embodiment of the present invention.
Figure 10B:
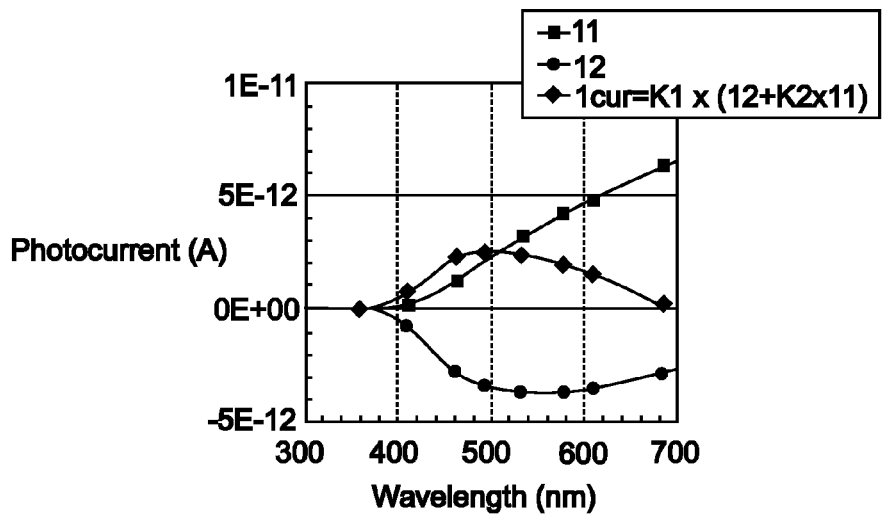
FIG. 10B is a graph showing a light receiving sensitivity of a visible light sensor in a visible wavelength range.

Next, an operation of the optical sensor according to the embodiment of the present invention will be described with reference to FIGS. 10A and 10B. FIG. 10A is a schematic view illustrating a structure and an operation state of the light receiving region 20 for illustrating the operation of the optical sensor according to the embodiment of the present invention. FIG. 10B is a graph showing a light receiving sensitivity of the visible light sensor 3 in a visible wavelength range.

In the ultraviolet ray sensor 5, a voltage A0 is applied between the first high-concentration region 47 being an n$^+$ type region and the second high-concentration region 48 being a p$^+$ type region to thereby a depletion layer within the p$^-$ type low-concentration region 46. In the meantime, in the visible light sensor 3, a voltage A1 is applied between the first well high-concentration layer 30 and the second well high-concentration layer 31 to thereby form a depletion layer PD1. Similarly, a voltage A2 is applied between the second well high-concentration layer 31 and the third well high-concentration layer 32 to thereby form a depletion layer PD2. Similarly, a voltage A3 is applied between the third well high-concentration layer 32 and the fourth well high-concentration layer 33 to thereby form a depletion layer PD3.

When ultraviolet rays (ultraviolet light) and visible light are made incident onto the light receiving region 20 in such a state, the ultraviolet light is absorbed in the depletion layer of the ultraviolet ray sensor 5 and detected as a photodiode current (photocurrent). On the other hand, light in a visible wavelength range is not absorbed in the p⁻ type low-concentration region 46 but passes therethrough to reach the visible light sensor 3 formed inside the semiconductor support substrate 11. Then, electrons and holes are generated within the depletion layers PD1, PD2, and PD3 of the visible light sensor 3 by the visible light having passed through the low-concentration region 46 and detected as photocurrent. Here, when values of the photocurrent generated in the depletion layers PD1, PD2, and PD3 are I1, I2, and I3, by performing calculation based on these current values, it is possible to obtain characteristics having light receiving sensitivity at only the visible wavelength range.

For example, FIG. 10B shows a case where light having a wavelength ranging from 300 nm to 700 nm is made incident onto the light receiving region 20 to thereby detect photocurrent I1 and I2, and calculation is performed based on the photocurrent I1 and I2 to thereby calculate a photocurrent value corresponding to a visible wavelength range (from 400 nm to 700 nm). Specifically, when the photocurrent value corresponding to the visible wavelength range (from 400 nm to 700 nm) is Icur and coefficients are K1 and K2, the photocurrent value can be calculated as Icur=K1·(I2+K2·I1). Although this example calculates the photocurrent value using two photocurrent components I1 and I2, the calculation precision may be increased when three photocurrent components I1, I2, and I3 are used.

In accordance with the optical sensor according to the embodiment of the present invention, since the visible light sensor 3 is formed on the semiconductor support substrate 11 of the SOI substrate 10 and the ultraviolet ray sensor 5 is formed on the SOI layer 10, it is possible to realize an optical sensor having the ultraviolet ray sensor and the visible light sensor integrated into one chip. Moreover, since the visible light sensor 3 is formed below the ultraviolet ray sensor 5, an optical sensor having two sensors of a visible light sensor and an ultraviolet ray sensor can be formed in a small area corresponding to one sensor.

An optical sensor according another embodiment of the present invention will be now described with reference to FIGS. 11A and 11B. FIG. 11A is a top plan view of the optical sensor according to the modification, and FIG. 11B is a cross-sectional view along line B-B in FIG. 11A. For better understanding of the structure, an illustration of some elements (e.g., a contact plug and the like) is omitted in FIG. 11A.

The optical sensor according to present invention embodiment is the same as the optical sensor according to the embodiment in that a visible light sensor is formed on a semiconductor support substrate of a SOI substrate, and an ultraviolet ray sensor is formed on a SOI layer. However, the two optical sensors are different in that in the optical sensor according to the present embodiment, the visible light sensor is formed at a region of the semiconductor support substrate other than a region disposed below the ultraviolet ray sensor.

In description of this modification, the same or similar components, elements, portions, and the like as the above-described embodiment will be denoted by the same reference numerals, and thus, a redundant description thereof will be omitted.

The optical sensor according to the present embodiment differs from that of the previous embodiment primarily in that the visible light sensor 3 is formed at a region of the semiconductor support substrate 11 other than a region disposed below the ultraviolet ray sensor 5. That is, in this embodiment, the visible light sensor 3 is formed at a region of the light receiving region 20 of the semiconductor support substrate 11 disposed adjacent to a region disposed below the ultraviolet ray sensor 5. For this reason, the SOI layer 13 and the buried insulating film 12 are not present on the visible light sensor 3. Due to this configuration, it is possible to form the first to fourth wells 26 to 29 in the process step for fabricating the visible light sensor 3 in a well controlled manner.

That is, in an embodiment of the present invention, as illustrated in FIGS. 2B to 3B, ion implantation for forming the first to fourth wells 26 to 29 is performed via the buried insulating film 12 and the SOI layer 13. However, in order to form the first to fourth wells 26 to 29 in a well controlled manner, it may be better to perform the ion implantation without via the buried insulating film 12 and the SOI layer 13 but directly on the semiconductor support substrate 11. It is to be noted that as shown in the embodiment, even when the ion implantation is performed on the semiconductor support substrate 11 via the buried insulating film 12 and the SOI layer 13, it is sufficiently possible to form the first to fourth wells 26 to 29. Therefore, both or either one of the SOI layer 13 and the buried insulating film 12 may be formed on the visible light sensor 3.

In addition, it may be preferred to cause the first to third wells of the optical sensor according to the modification to be diffused deeper than the diffusion depth d1 of the first well 26, the diffusion depth d2 of the second well 27, and the diffusion depth d3 of the third well 28 of the optical sensor according to the embodiment. This is because in this embodiment, the SOI layer 13 exhibiting the function of a UV filter is not formed on the visible light sensor 3. However, in a case where the buried insulating film 12 and the SOI layer 13 are formed on the visible light sensor 3 similar to the case of the embodiment, the first to third wells according to the modification may be diffused at the same depth as the diffusion depth d1 of the first well 26, the diffusion depth d2 of the second well 27, and the diffusion depth d3 of the third well 28 of the optical sensor according to the embodiment.

In accordance with the optical sensor according to this embodiment of the present invention, since the visible light sensor 3 is formed on the semiconductor support substrate 11 of the SOI substrate 10 and the ultraviolet ray sensor 5 is formed on the SOI layer 10, it is possible to realize an optical sensor having the ultraviolet ray sensor and the visible light sensor integrated into one chip.

Moreover, since the visible light sensor 3 is formed at a region of the semiconductor support substrate 11 other Man a region disposed below the ultraviolet ray sensor 5, it is not necessary to form the SOI layer 13 and the buried insulating film 12 on the visible light sensor 3. Due to this configuration, it is possible to form the first to fourth wells 26 to 29 in the process step for fabricating the visible light sensor 3 in a well controlled manner.

Although the present invention has been described in connection with selected embodiments, it is not limited thereto. It will be apparent to those skilled in the art that various substitutions, modifications and changes may be thereto without departing from the scope of the invention as defined by the appended claims.

What is claimed is:

1. An optical sensing device, comprising:
a silicon-on-insulator (SOI) substrate which includes a semiconductor support substrate, an insulating layer located on the semiconductor support substrate, and a semiconductor layer located on the insulating layer;
a visible light sensor located in the semiconductor support substrate; and
an ultraviolet ray sensor located in the semiconductor layer,
the ultraviolet ray sensor comprising an ultraviolet photodiode configured by a low-concentration region of a first conductivity type formed within the semiconductor layer, a first high-concentration region of a second conductivity type formed adjacent to the low-concentration region, and a second high-concentration region of the first conductivity type formed adjacent to the low-concentration region, wherein the low-concentration region is sandwiched between the first and second high-concentration regions, and
wherein an impurity concentration of the first and second high-concentration regions is greater than an impurity concentration of the low-concentration region, and the first and second high-concentration regions have a thickness greater than a thickness of the low-concentration region.

2. The optical sensing device according to claim 1, wherein the visible light sensor is located below the ultraviolet ray sensor relative to an upper surface of the semiconductor layer.

3. The optical sensing device according to claim 1, wherein the visible light sensor is not located below the ultraviolet ray sensor relative to an upper surface of the semiconductor layer.

4. The optical sensing device according to claim 1, wherein the semiconductor layer further includes a control circuit device.

5. The optical sensing device according to claim 1, wherein the semiconductor support substrate has the first conductivity type, and wherein the visible light sensor comprises:
a first visible light photodiode configured by a first well of the second conductivity type formed within the semiconductor support substrate and a second well of the first conductivity type formed within the first well; and
a second visible light photodiode configured by the second well and a third well of the second conductivity type formed within the second well.

6. The optical sensing device according to claim 5, wherein the first well, the second well, and the third well of the visible light sensor are located below the low-concentration region of the ultraviolet ray sensor.

7. The optical sensing device according to claim 6, wherein the visible light sensor further comprises:
a third visible light photodiode configured by the third well and a fourth well of the first conductivity type formed within the third well and located below the low-concentration region of the ultraviolet ray sensor.

8. The optical sensing device according to claim 5, wherein the semiconductor layer further includes a control circuit device.

9. The optical sensing device according to claim 5, wherein the visible light sensor is located below the ultraviolet ray sensor relative to an upper surface of the semiconductor layer.

10. The optical sensing device according to claim 5, wherein the visible light sensor is not located below the ultraviolet ray sensor relative to an upper surface of the semiconductor layer.

11. The optical sensing device according to claim 10, wherein the SOI substrate includes a portion in which the insulating layer is not interposed between the semiconductor layer and the semiconductor support substrate, and wherein the visible sensor is located at the portion of the SOI substrate.

12. The optical sensing device according to claim 1, wherein the thickness of the low-concentration region is in the range of 3 nm to 36 nm.

13. The optical sensing device according to claim 1, wherein the thickness of the first high-concentration region and the second high-concentration region is 30 nm or more.

14. The optical sensing device according to claim 12, wherein the thickness of the first high-concentration region and the second high-concentration region is 30 nm or more.

15. The optical sensing device according to claim 8, wherein the thickness of each of the first high-concentration region and the second high-concentration region is the same as a thickness of a portion of the semiconductor layer at which the control circuit device is located.

16. The optical sensing device according to claim 15, wherein the thickness of each of the first high-concentration region and the second high-concentration region is in the range of 40 nm to 100 nm.

17. An optical sensing device, comprising:
a silicon-on-insulator (SOI) substrate which includes a semiconductor support substrate, an insulating layer located on the semiconductor support substrate, and a semiconductor layer located on the insulating layer;
a visible light sensor located in the semiconductor support substrate; and
an ultraviolet ray sensor located in the semiconductor layer,
the ultraviolet ray sensor comprising an ultraviolet photodiode configured by a first region of a first conductivity type formed within the semiconductor layer, a second region of a second conductivity type, and a third region of the first conductivity type, wherein the first region is sandwiched between the second and third regions, and
wherein the second and third regions have a thickness greater than a thickness of the first region.

18. The optical sensing device according to claim 17, wherein the visible light sensor is located under the ultraviolet ray sensor.

19. The optical sensing device according to claim 17, wherein the visible light sensor is not located under the ultraviolet ray sensor.

20. The optical sensing device according to claim 17, wherein the semiconductor layer further includes a control circuit device, and the thickness of the second and third regions is the same as a thickness of a portion of the semiconductor layer at which the control circuit device is located.

* * * * *